United States Patent
Tanaka

(10) Patent No.: US 7,830,930 B2
(45) Date of Patent: Nov. 9, 2010

(54) SEMICONDUCTOR LASER DEVICE

(75) Inventor: Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 12/204,223

(22) Filed: Sep. 4, 2008

(65) Prior Publication Data
US 2009/0067464 A1 Mar. 12, 2009

(30) Foreign Application Priority Data
Sep. 5, 2007  (JP) ............................. 2007-230192

(51) Int. Cl.
*H01S 3/13* (2006.01)
*H01S 3/00* (2006.01)
*H01S 3/097* (2006.01)

(52) U.S. Cl. .............................. 372/29.013; 372/38.05; 372/87

(58) Field of Classification Search ............ 372/29.013, 372/38.05, 87
See application file for complete search history.

(56) References Cited

FOREIGN PATENT DOCUMENTS

| JP | 2003-031894 | * | 1/2003 |
|----|-------------|---|--------|
| JP | 2004-186708 |   | 7/2004 |
| JP | 2006-310413 |   | 11/2006 |
| JP | 2007-081295 |   | 3/2007 |
| JP | 2007-189034 |   | 7/2007 |

OTHER PUBLICATIONS

Japanese Offie Action for 2007-230192 mailed on Jan. 4, 2010.

\* cited by examiner

*Primary Examiner*—Armando Rodriguez
(74) *Attorney, Agent, or Firm*—Turocy & Watson, LLP

(57) ABSTRACT

A semiconductor laser device includes: a laminated body including an active layer, a cladding layer provided on the active layer, and a contact layer provided on the cladding layer, the laminated body having a first and second end face forming a resonator for light emitted from the active layer; and an electrode provided on the contact layer and including an ohmic section injecting a current into the active layer and a first current adjustment section provided between one end of the ohmic section and the first end face. The ohmic section contains a metal which has a smaller work function than any metal constituting the current adjustment section.

20 Claims, 3 Drawing Sheets

(12) United States Patent

SEMICONDUCTOR LASER DEVICE

CROSS-REFERENCE TO RELATED APPLICATIONS

This application is based upon and claims the benefit of priority from the prior Japanese Patent Application No. 2007-230192, filed on Sep. 5, 2007; the entire contents of which are incorporated herein by reference.

BACKGROUND OF THE INVENTION

1. Field of the Invention

This invention relates to a semiconductor laser device.

2. Background Art

In semiconductor laser devices, a high optical output is achieved by increasing the level at which COD (catastrophic optical damage) occurs. To increase the COD level, AlGaAs-based and InGaAlP-based semiconductor laser devices are often based on a window structure in which the active layer near the end faces to constitute an optical resonator is disordered to widen the bandgap and reduce optical absorption.

However, in InGaN-based blue-violet semiconductor laser devices for the next-generation DVD (digital versatile disc), the active layer is difficult to disorder, and the window structure is difficult to use. In a structure to solve this difficulty, for example, a current non-injection region, where no electrode is formed, is provided near the end face to prevent temperature increase due to non-radiative recombination and increase the COD level.

In this case, the vicinity of the boundary between the electrode non-formation region without current injection and the electrode formation region undergoes a stress-induced strain due to temperature increase and decrease of several hundred ° C. in the laser element mounting process. Such a stress-induced strain deteriorates the characteristics and reliability of the laser element.

JP-A 2004-186708 (Kokai) discloses a technique related to a gallium nitride-based semiconductor laser element having good lasing characteristics as a light source for optical disks. This technique provides a gallium nitride-based semiconductor laser element in which the length, along the laser resonator, of the ohmic electrode for supplying a current to the active layer is shorter than the length of the laser resonator. However, this structure is insufficient for preventing the stress-induced strain.

SUMMARY OF THE INVENTION

According to an aspect of the invention, there is provided a semiconductor laser device including: a laminated body including an active layer, a cladding layer provided on the active layer, and a contact layer provided on the cladding layer, the laminated body having a first and second end face forming a resonator for light emitted from the active layer; and an electrode provided on the contact layer and including an ohmic section injecting a current into the active layer and a first current adjustment section provided between one end of the ohmic section and the first end face, the ohmic section containing a metal which has a smaller work function than any metal constituting the current adjustment section.

According to another aspect of the invention, there is provided a semiconductor laser device including: a laminated body including an active layer, a cladding layer provided on the active layer, and a contact layer provided on the cladding layer, the laminated body having a first and second end face forming a resonator for light emitted from the active layer; and an electrode provided on the contact layer and including an ohmic section injecting a current into the active layer and a first current adjustment section provided between one end of the ohmic section and the first end face, the current adjustment section containing a metal which forms Schottky contact with the contact layer. According to another aspect of the invention, there is provided a semiconductor laser device including: a laminated body including an active layer, a cladding layer provided on the active layer, and a contact layer provided on the cladding layer, the laminated body having a first and second end face forming a resonator for light emitted from the active layer; and an electrode provided on the contact layer and including an ohmic section injecting a current into the active layer, a first current adjustment section provided between one end of the ohmic section and the first end face, and a second current adjustment section provided between the other end of the ohmic section and the second end face, the ohmic section containing a metal which has a smaller work function than any metal constituting the first and second current adjustment section.

DETAILED DESCRIPTION OF THE INVENTION

An embodiment of the invention will now be described with reference to the drawings.

Figure 1A:
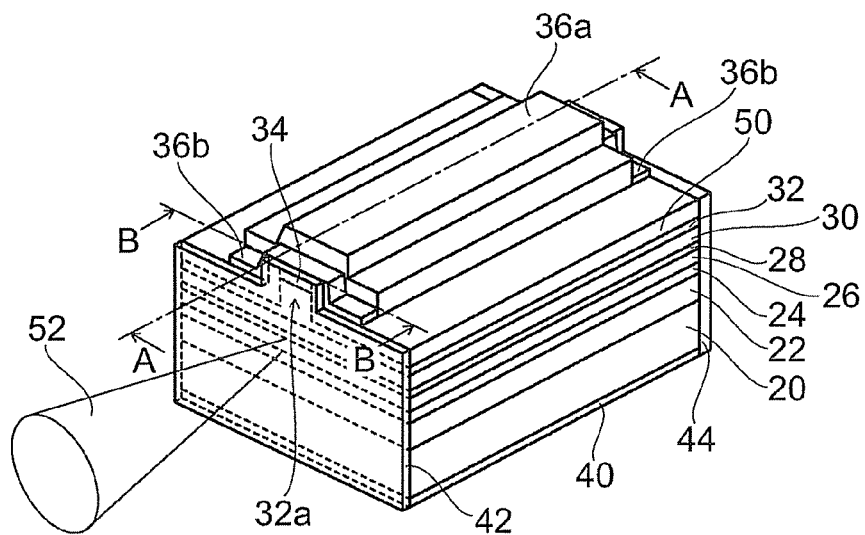
FIGS. 1A to 1C show a semiconductor laser device according to a first embodiment.
Figure 1B:
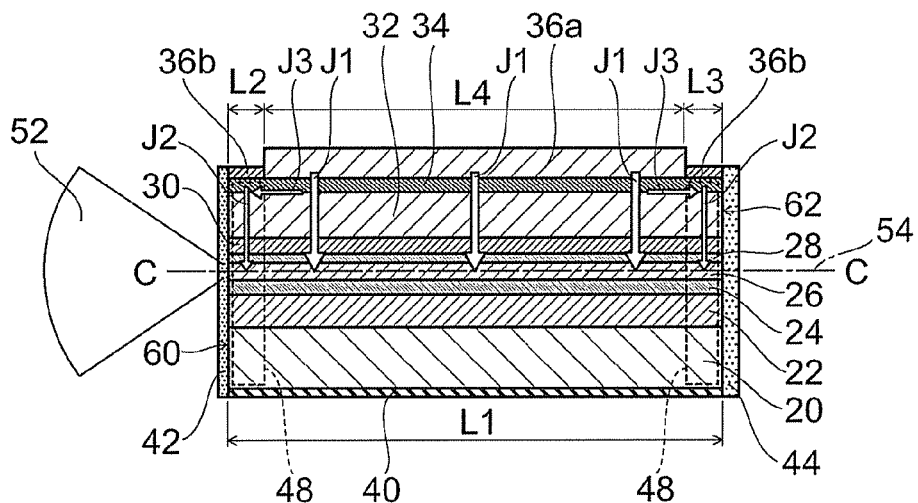
Figure 1C:
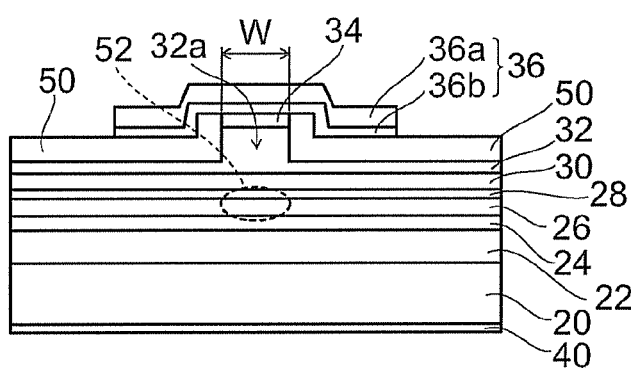

FIG. 1 shows a semiconductor laser device according to an embodiment of the invention, in which FIG. 1A is a schematic perspective view, FIG. 1B is a schematic cross-sectional view taken along line A-A, and FIG. 1C is a schematic front view.

On a substrate 20 such as an n-type GaN substrate is formed a laminated body including an n-type cladding layer 22, an n-type optical guide layer 24, an active layer 26, an overflow prevention layer 28, a p-type optical guide layer 30, a p-type cladding layer 32, and a contact layer 34. This laminated body can be formed by epitaxial growth in this order using MOCVD (metal organic chemical vapor deposition) or MBE (molecular beam epitaxy), for example.

As shown in FIG. 1B, a p-side electrode 36 is provided on the contact layer 34. The p-side electrode 36 includes an ohmic section 36a (thickness: 100 to 1000 nm) and a current adjustment section 36b (thickness: 5 to 100 nm) provided between the end of the ohmic section 36a and the end face 60, 62 of the chip. The end faces 60, 62 are cleavage surfaces and constitute an optical resonator. Stimulated emission light from the active layer 26 is resonated by the optical resonator along line A-A and guided along the ridge waveguide 32a. Let L4 denote the length of the ohmic section 36a measured parallel to the optical axis 54, represented by line C-C, passing through generally the center of the cross section of the active layer 26. Furthermore, let L2 denote the length of the current adjustment section 36b between one end of the ohmic section 36a and the end face 60 measured parallel to the optical axis 54, and let L3 denote the length of the current adjustment section 36b between the other end and the end face 62 measured parallel to the optical axis 54. In addition, let L1 denote the length of the optical resonator.

A front reflective film 42 is provided on the end face 60, and a rear reflective film 44 is provided on the end face 62. By setting the reflectance of the front reflective film 42 to e.g. 5 to 30% and setting the reflectance of the rear reflective film 44 to e.g. 80% or more, the optical output of the light beam 52 from the front reflective film 42 can be increased, and the output efficiency can be improved. It is noted that FIG. 1C is a schematic front view before the formation of the front reflective film 42, showing the end face 60 taken along line B-B of FIG. 1A.

Figure 2A:
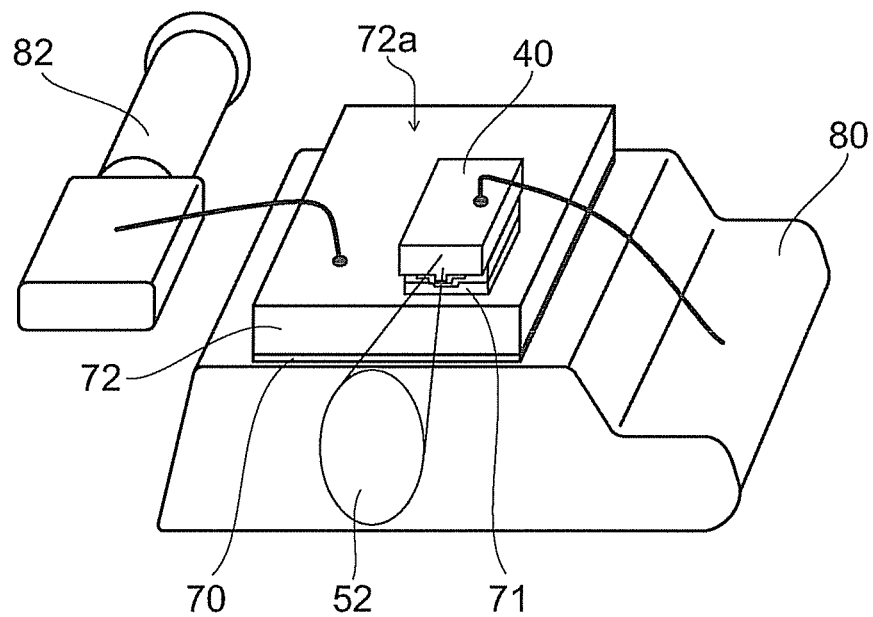
FIGS. 2A and 2B show a semiconductor laser device mounted on a package.
Figure 2B:
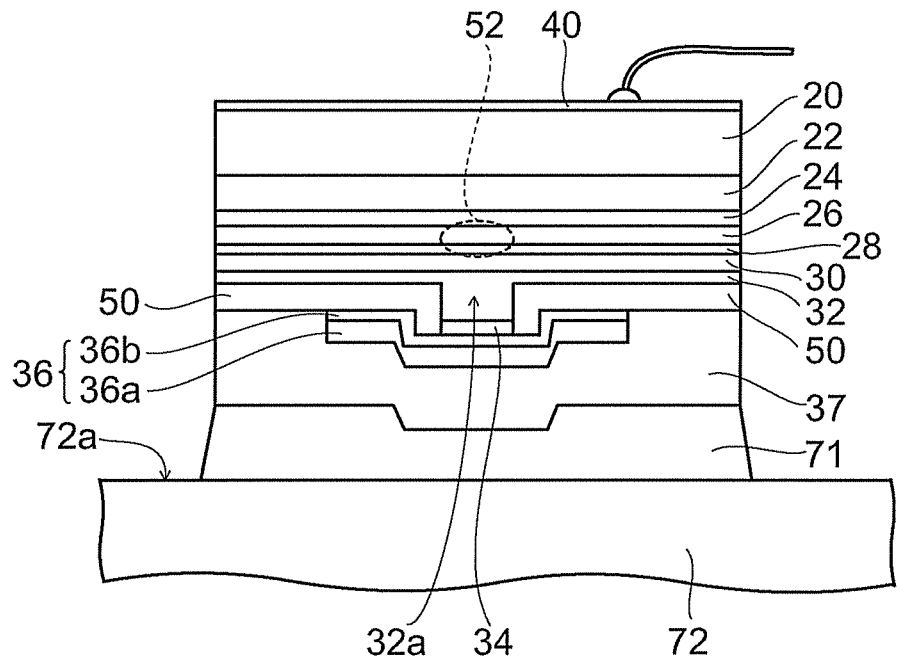

FIG. 2 shows a semiconductor laser device mounted on a package, in which FIG. 2A is a schematic perspective view, and FIG. 2B is a schematic front view. A pad electrode 37 made of Au or the like is provided to cover the upper surface of the p-side electrode 36 and the upper surface of the insulating film 50 of the semiconductor laser device shown in FIG. 1. A heat sink 80 made of the metal of the stem is bonded to a submount 72 made of AlN (aluminum nitride) or the like by a solder 70 or the like. The pad electrode 37 is bonded to the conductive portion 72a on the submount 72 by a solder 71 of AuSn or the like. Heat resistance can be reduced by decreasing the distance between the active layer 26 and the submount 72 to as short as 5 µm or less, for example. The structure like this is called the junction-down structure, which facilitates improving temperature characteristics. The pad electrode 37 serves to reduce the stress due to mounting of the chip.

Here, a description is given of the laminated body formed by crystal growth. For example, the n-type cladding layer 22 is made of $Al_{0.04}Ga_{0.96}N$ (thickness: 0.5 to 2.0 µm), the n-type optical guide layer 24 is made of GaN (thickness: 0.01 to 0.10 µm), the active layer 26 is a MQW made of $In_{0.13}Ga_{0.87}N$/$In_{0.01}Ga_{0.99}N$ (thickness of the well layer: 2 to 5 nm, number of wells: 2 to 4, thickness of the barrier layer: 6 to 15 nm), the overflow prevention layer 28 is made of $p^+$-type $Al_{0.2}Ga_{0.8}N$ (thickness: 5 to 20 nm, effective acceptor concentration: $3 \times 10^{18}$ cm$^{-3}$), and the p-type optical guide layer 30 is made of GaN (thickness: 0.01 to 0.10 µm). Thus, a blue-violet light beam 52 is emitted from the active layer 26.

Furthermore, the p-type cladding layer 32 thereon is made of $Al_{0.04}Ga_{0.96}N$ (thickness: 0.4 to 2.0 µm), and the contact layer 34 is made of $p^+$-type GaN (thickness: 0.02 to 0.20 µm). The contact layer 34 and the upper portion of the p-type cladding layer 32 are processed into a striped configuration, and the striped portion of the p-type cladding layer 32 serves as a ridge waveguide 32a. The upper surface of the p-type cladding layer 32 on both sides of the ridge waveguide 32a, the sidewall of the ridge waveguide 32a, and the sidewall of the contact layer 34 are covered with an insulating film 50 made of $SiO_2$ or the like.

The vertical transverse beam divergence angle can be controlled by varying the composition of the n-type optical guide layer 24 and the p-type optical guide layer 30. The overflow prevention layer 28 prevents electrons injected from the substrate 20 side from leaking to the p-type cladding layer 32 and unnecessarily increasing the operating current.

If the width W of the ridge waveguide 32a is illustratively 1.5 to 2.5 µm, light parallel to the active layer 26 is confined within the ridge waveguide 32a because of the refractive index difference between the p-type cladding layer 32 and the insulating film 50, facilitating horizontal transverse mode control. Hence, a light beam 52 having a small spot diameter required for the next-generation DVD can be easily obtained. The structure of this embodiment is referred to as the real index guided structure. The optical loss of the blue-violet light beam is small inside the laminated body, and a high optical output can be obtained.

In this embodiment, the ohmic section 36a is selected so as to contain a metal having a smaller work function than any metal constituting the current adjustment section 36b. More specifically, the current adjustment section 36b is illustratively made of Ni or Pt, and the ohmic section 36a is made of at least one of Au, a metal lamination containing Au, and an alloy layer containing Au. Because Ni, Pt has a higher work function than Au, the current adjustment section 36b can serve as a Schottky electrode or an electrode having a high contact resistance. On the other hand, the ohmic section 36a, containing Au, can serve as an ohmic electrode having a lower contact resistance.

Such a p-side electrode 36 can be formed by providing Ni or Pt entirely on the contact layer 34 provided on the ridge waveguide 32a, then providing Au only on the portion to serve as the ohmic section 36a, and applying sintering treatment so that the ohmic section 36a forms ohmic contact and the current adjustment section 36b forms e.g. Schottky contact.

In the case where a forward voltage is applied to the p-side electrode 36, the density of the current injected from the current adjustment section 36b into the contact layer 34 is lower than that of the current J1 injected from the ohmic section 36a into the contact layer 34. In particular, the current injected from the current adjustment section 36b into the contact layer 34 can be made sufficiently lower than J1 by increasing the Schottky barrier of the current adjustment section 36b. In this case, part of the current J1 injected from the ohmic section 36a is turned into a current J3 diffused parallel to the optical axis 54 toward the outside by the electric field applied to the current adjustment section 36b, which is further turned into J2 directed downward in the low-injection region 48.

Next, the function of such a current adjustment section 36b is described.

Figure 3A:
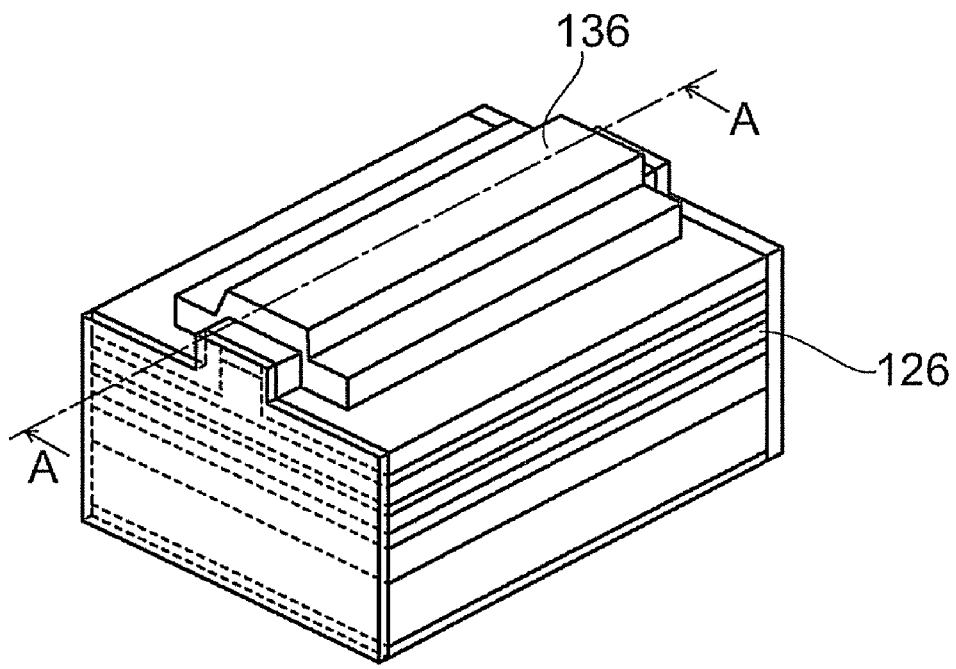
FIGS. 3A and 3B show a semiconductor laser device according to a comparative example.
Figure 3B:
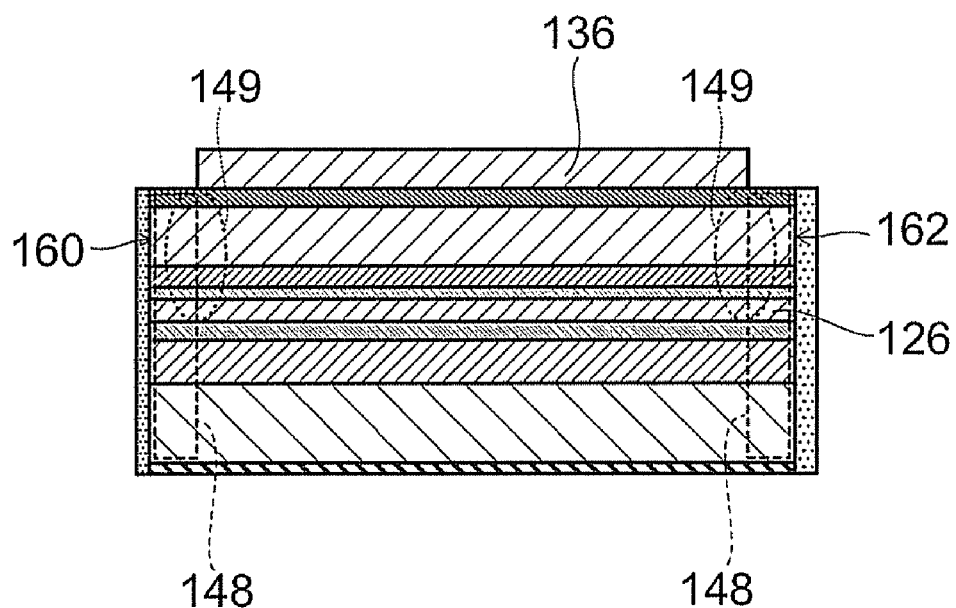

FIG. 3 shows a semiconductor laser device according to a comparative example, in which FIG. 3A is a schematic perspective view, and FIG. 3B is a schematic cross-sectional view taken along line A-A. In this comparative example, no electrode is provided on the portion near the end face 160, 162, and this portion serves as a current non-injection region 148. If the current is substantially zero, non-radiative recombination scarcely occurs. Hence, bandgap narrowing due to heat generation can be prevented, and decrease of the COD level can also be prevented. However, a stress occurs near the boundary 149 (indicated by dots) between the end of the electrode 136 and the current non-injection region 148, and a stress-induced strain occurs near the active layer 126. If this boundary 149 includes a deep position inside the active layer 126 along the optical axis, the effect of the stress-induced strain exerted on the inside of the crystal is further increased and deteriorates the characteristics and reliability. In this case, a large injection current into the inside of the crystal subjected to the stress-induced strain may accelerate the deterioration of the characteristics and reliability.

In contrast, in this embodiment, a current adjustment section 36b is formed in the p-side electrode 36 to form a low-injection region 48 near the end faces 60, 62, thereby preventing the decrease of carrier density and the temperature increase due to non-radiative recombination. This prevents the positive feedback loop of temperature increase, bandgap narrowing, optical absorption, and further temperature increase. Thus, a high COD level can be maintained.

The current adjustment section 36b and the ohmic section 36a are both made of metal. Thus, the stress-induced strain near the boundary therebetween is easily reduced. Furthermore, even if a stress-induced strain occurs on the end face 60, 62 side of the current adjustment section 36b, its effect on the inside of the crystal is smaller than that on the deep inside along the optical axis 54. In particular, in the low-injection region 48, because of the low operating current therein, characteristics variation occurring inside the crystal can be further reduced. This facilitates preventing the decrease of reliability.

Next, a description is given of the bar cleavage step for forming the end faces 60, 62 to constitute an optical resonator. In the step of cleaving into a bar configuration, thick Au at the scribe position may prevent the cleavage from having a desired direction and cause the cleavage to be discontinuously bent. Thus, the characteristics and yield may be deteriorated. In this embodiment, in the current adjustment section 36b, thick Au is not formed, but thin Ni or Pt is formed. Thus, the cleavage step is performed more reliably, and the characteristics and yield can be easily improved.

In this embodiment, even without injecting a current into the low-injection region 48, the decrease of the COD level can be prevented, and the stress-induced strain can be reduced. However, injection of a low current facilitates preventing self-excited oscillation. In general, the p-type layer has a lower mobility than the n-type layer. Hence, in a wide area of the current non-injection region, the current is difficult to spread into the active layer. This decreases the gain and increases the absorption loss, which results in increased threshold current and decreased efficiency.

Furthermore, the blue-violet semiconductor laser device made of InGaAlN in the 400 nm band has a lower mobility than the red semiconductor laser device made of InGaAlP in the 650 to 700 nm band. For these reasons, in the comparative example, for instance, the active layer 126 of the current non-injection region 148 is likely to act as a saturable absorption layer, and unintended self-excited oscillation is likely to occur if the total length of the current non-injection region 148 along the optical axis is 1 to 100 μm. Self-excited oscillation increases the operating current, and hence increases power consumption.

In contrast, in this embodiment, an electric field is applied to the current adjustment section 36b. Part of the injection current J1 from the ohmic section 36a into the contact layer 34 is diffused to produce an injection current 32, which gradually decreases toward the end face 60, 62. This prevents non-radiative recombination. Thus, self-excited oscillation can be prevented while increasing the COD level near the end faces 60, 62. The current increase due to this injection current J2 is smaller than the current increase due to self-excited oscillation, and thus the increase of current consumption is small.

It is possible to omit one of the low-injection region 48 on the end face 60 side (length L2) and the low-injection region 48 on the end face 62 side (length L3). However, it is preferable to provide them on both sides to more effectively prevent the decrease of the COD level. Furthermore, the length is not limited to L2=L3. With large L2 and L3, the current distribution along the optical axis 54 in the active layer 26 becomes more nonuniform, and the threshold current and the operating voltage also increase. Hence, L2+L3 is preferably 100 μm or less.

The embodiment of the invention has been described with reference to the drawings. However, the invention is not limited to the above embodiment. The material, shape, size, and layout of the laminated body, active layer, cladding layer, contact layer, p-side electrode, ohmic section, current adjustment section, reflective film, and low-injection region constituting the semiconductor laser device can be modified by those skilled in the art, and such modifications are also encompassed within the scope of the invention as long as they do not depart from the spirit of the invention.

The invention claimed is:

1. A semiconductor laser device comprising:
    a laminated body including an active layer, a cladding layer provided on the active layer, and a contact layer provided on the cladding layer, the laminated body having a first and second end face forming a resonator for light emitted from the active layer; and
    an electrode provided on the contact layer and including an ohmic section injecting a current into the active layer and a first current adjustment section provided between one end of the ohmic section and the first end face,
    the ohmic section containing a metal which has a smaller work function than any metal constituting the first current adjustment section, and the metal constituting the current adjustment section on a side which is in contact with the contact layer.

2. The semiconductor laser device according to claim 1, wherein the length of the first current adjustment section along the optical axis of the resonator is 100 μm or less.

3. The semiconductor laser device according to claim 1, wherein the ohmic section has a larger thickness than the first current adjustment section.

4. The semiconductor laser device according to claim 1, wherein the upper portion of the cladding layer constitutes a ridge waveguide.

5. The semiconductor laser device according to claim 1, wherein
    the active layer is a multiple quantum well made of $In_xGa_{1-x}N/In_yGa_{1-y}N$ ($0.05 \leq x \leq 1$, $0 \leq y \leq 1$, $x > y$),
    the cladding layer is made of $Al_tGa_{1-t}N$ ($0 < t \leq 0.05$), and
    the contact layer is made of GaN.

6. The semiconductor laser device according to claim 1, wherein the laminated body further includes an overflow prevention layer between the active layer and the cladding layer.

7. The semiconductor laser device according to claim 1, comprising:
    wherein the current adjustment section contains a metal which forms Schottky contact with the contact layer.

8. The semiconductor laser device according to claim 7, wherein the length of the first current adjustment section along the optical axis of the resonator is 100 μm or less.

9. The semiconductor laser device according to claim 7, wherein the ohmic section has a larger thickness than the first current adjustment section.

10. The semiconductor laser device according to claim 7, wherein the current adjustment section contains Ni or Pt.

11. The semiconductor laser device according to claim 10, wherein the ohmic section includes one of Au, a metal lamination containing Au, an alloy layer containing Au, Pd, a metal lamination containing Pd, and an alloy layer containing Pd.

12. A semiconductor laser device comprising:
    a laminated body including an active layer, a cladding layer provided on the active layer, and a contact layer provided on the cladding layer, the laminated body having a first and second end face forming a resonator for light emitted from the active layer; and
    an electrode provided on the contact layer and including an ohmic section injecting a current into the active layer, a first current adjustment section provided between one end of the ohmic section and the first end face, and a second current adjustment section provided between the other end of the ohmic section and the second end face, the ohmic section containing a metal which has a smaller work function than any metal constituting the first and second current adjustment section, the metal constituting the first current adjustment section, and the metal constituting the second current adjustment section on a side which is in contact with the contact layer.

13. The semiconductor laser device according to claim 12, wherein the difference between the length of the resonator along its optical axis and the length of the ohmic section along the optical axis of the resonator is 100 μm or less.

14. The semiconductor laser device according to claim 12, wherein the ohmic section has a larger thickness than the first and second current adjustment section.

15. The semiconductor laser device according to claim 12, wherein the upper portion of the cladding layer constitutes a ridge waveguide.

16. The semiconductor laser device according to claim 12, wherein
the active layer is a multiple quantum well made of $In_x Ga_{1-x}N/In_y Ga_{1-y}N$ ($0.05 \leqq x \leqq 1$, $0 \leqq y \leqq 1$, $x>y$),
the cladding layer is made of $Al_t Ga_{1-t}N$ ($0 \leqq t \leqq 0.05$), and the contact layer is made of GaN.

17. The semiconductor laser device according to claim 12, wherein the laminated body further includes an overflow prevention layer between the active layer and the cladding layer.

18. The semiconductor laser device according to claim 12, wherein the first and second current adjustment section contain a metal which forms Schottky contact with the contact layer.

19. The semiconductor laser device according to claim 18, wherein the first and second current adjustment section each contain Ni or Pt.

20. The semiconductor laser device according to claim 19, wherein the ohmic section includes one of Au, a metal lamination containing Au, an alloy layer containing Au, Pd, a metal lamination containing Pd, and an alloy layer containing Pd.

* * * * *